(12) United States Patent
Maligeorgos

(10) Patent No.: US 6,535,037 B2
(45) Date of Patent: Mar. 18, 2003

(54) INJECTION LOCKED FREQUENCY MULTIPLIER

(75) Inventor: James Maligeorgos, 2600 Lake Austin Blvd., Apt. 8103, Austin, TX (US) 78703

(73) Assignee: James Maligeorgos, Austin, TX (US)

( * ) Notice: Subject to any disclaimer, the term of this patent is extended or adjusted under 35 U.S.C. 154(b) by 0 days.

(21) Appl. No.: 09/776,050

(22) Filed: Feb. 2, 2001

(65) Prior Publication Data

US 2002/0039039 A1 Apr. 4, 2002

Related U.S. Application Data

(60) Provisional application No. 60/180,168, filed on Feb. 4, 2000.

(51) Int. Cl.[7] .................................................. H03B 19/00
(52) U.S. Cl. ........................ 327/116; 327/122; 327/119; 331/53
(58) Field of Search ................................ 327/116, 119, 327/120, 122, 165, 231, 238, 239, 243, 245, 246, 247, 254, 256–259, 291, 293–295; 331/53, 57

(56) References Cited

U.S. PATENT DOCUMENTS

| | | | | |
|---|---|---|---|---|
| 5,180,994 A | * | 1/1993 | Martin et al. | 331/38 |
| 5,418,498 A | * | 5/1995 | DeVito et al. | 331/57 |
| 5,436,939 A | * | 7/1995 | Co et al. | 375/76 |
| 5,489,878 A | * | 2/1996 | Gilbert | 331/57 |
| 5,596,302 A | * | 1/1997 | Mastrocola et al. | 331/57 |
| 5,635,879 A | * | 6/1997 | Sutardja et al. | 331/57 |
| 5,686,867 A | * | 11/1997 | Sutardja et al. | 331/57 |
| 5,705,947 A | * | 1/1998 | Jeong | 327/270 |
| 5,764,111 A | * | 6/1998 | Bushman | 331/57 |
| 5,917,383 A | * | 6/1999 | Tso et al. | 331/57 |
| 5,963,101 A | * | 10/1999 | Iravani | 331/57 |
| 6,094,103 A | * | 7/2000 | Jeong et al. | 331/57 |
| 6,097,256 A | * | 8/2000 | Juang et al. | 331/57 |

OTHER PUBLICATIONS

Maligeorgos, James, et al., "A 2V 5.1–5.8 GHz Image–Reject Receiver with Wide Dynamic Range," IEEE International Solid–State Circuits Conference, Feb. 9, 2000, pp. 322–323.

Maligeorgos, James P., et al., "A Low–Voltage 5.1–5.8 GHz Image–Reject Receiver with Wide Dynamic Range," IEEE Journal of Solid–State Circuits, vol. 35, No. 12, Dec. 2000, pp. 1917–1926.

(List continued on next page.)

*Primary Examiner*—Timothy P. Callahan
*Assistant Examiner*—Hai L. Nguyen
(74) *Attorney, Agent, or Firm*—Winstead Sechrest & Minick P.C.; Michael P. Adams

(57) ABSTRACT

A frequency multiplication circuit is disclosed. The circuit includes a ring oscillator formed of an even number of phase shifting stages. Each phase shifting stage provides a high frequency output comprised of harmonics of the oscillation frequency of the oscillator. An input signal having a first frequency is injected into a feedback node of the oscillator, thereby injection locking the oscillator to the input signal such that the oscillation frequency of the oscillator is equal to the first frequency. An output signal is extracted from two of the phase shifting stages. One of the harmonic frequencies may be isolated in the output signal, thereby providing a clean output at a multiple of the input frequency. When the circuit is operated at high frequencies, the output signal consists substantially of the second harmonic frequency and the circuit operates as a frequency doubler. A pair of frequency doublers may be cascaded to form a frequency quadrupler capable of providing an output signal with a frequency greater than 10 GHz.

8 Claims, 9 Drawing Sheets

U.S. PATENT DOCUMENTS

| | | | | |
|---|---|---|---|---|
| 6,104,254 A | * | 8/2000 | Iravani | 331/57 |
| 6,163,184 A | * | 12/2000 | Larsson | 327/156 |
| 6,163,186 A | * | 12/2000 | Kurita | 327/157 |
| 6,188,291 B1 | * | 2/2001 | Gopinathan et al. | 331/45 |
| 6,222,423 B1 | * | 4/2001 | Sudjian | 331/57 |
| 6,271,732 B1 | * | 8/2001 | Herzel | 331/57 |

OTHER PUBLICATIONS

Maligeorgos, James P., "A 3.8–6.4GHz Local Oscillator System Using an Injection–Locked Frequency Doubling and Phase Tuning Technique," A thesis submitted in conformity with the requirements for the degree of Master of Applied Science Department of Electrical and Computer Engineering, Univesity of Toronto, Toronto, Ontario, Canada, Copyright by James P. Maligeorgos 2001.

* cited by examiner

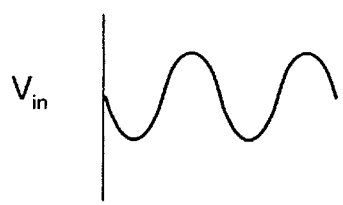
FIG. 4
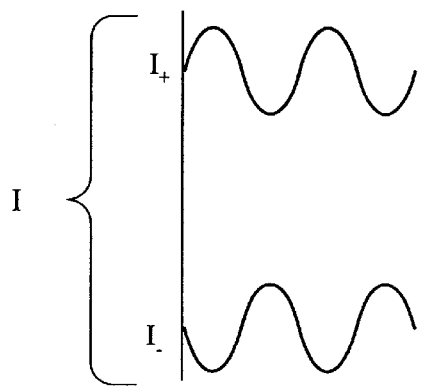
FIG. 5
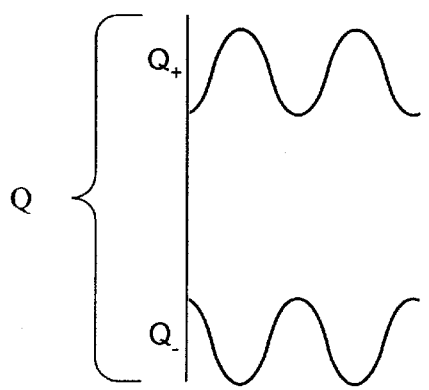
FIG. 6
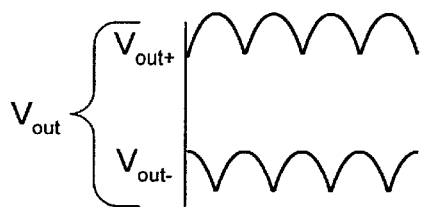
FIG. 7A
FIG. 7B
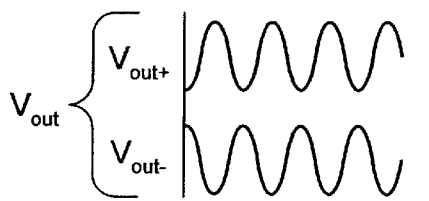
FIG. 8A
FIG. 8B

INJECTION LOCKED FREQUENCY MULTIPLIER

This application claims the benefit of Provisional application Ser. No. 60/180,168, filed Feb. 4, 2000.

FIELD OF THE INVENTION

This invention relates to frequency multiplication circuits. More particularly, this invention relates to a frequency multiplying circuit for use in telecommunications systems operating in the order of 5 GHz or higher.

BACKGROUND OF THE INVENTION

The proliferation of wireless communication technologies in recent years has created an increasing demand for new communication channels, or bandwidth. Generally, new channels have been provided by conducting communications at increasingly higher frequencies. Presently, commercial wireless communication is typically conducted using 900 MHz, 1.8 GHz and 2.4 GHz frequencies. Future wireless communications systems will use frequencies in the order of 5 GHz and greater.

A 2.6 GHz/5.2 GHz voltage controlled oscillator is described by Christopher Lam and Behzad Razavi in the 1999 IEEE International Solid-State Circuits Conference (ISSCC99/Session 23/Paper WP 23.6). This oscillator has a voltage controlled oscillator (VCO) consisting of two pairs of CMOS transistors. Each pair of transistors is connected in a common source configuration and the two pairs are cross coupled to provide a quadrature oscillator. Two outputs are taken from the common source nodes of the two transistors pairs, providing a differential output with a frequency double that of the oscillator. The oscillation frequency of the VCO is controlled by a DC control voltage generated by a phase locked loop control system. Such a system adds complexity to the oscillator, requires additional chip area and increases cost. In order to provide reliable inphase and quadrature (I and Q) local oscillator (LO) signals required in many radio communication systems for quadrature down conversion, it is preferable to generate a base signal with a frequency double the frequency required for the I and Q signals. For example, if 5.2 GHz I and Q signals are required, then a 10.4 GHz signal may be used to provide reliable 5.2 GHz I and Q signals. The base signal can then be reliably divided to provide the quadrature I and Q signals. As described, the circuit disclosed by Lam et al. can only be used to generate I and Q signals at the oscillators fundamental oscillating frequency of 2.6 GHz. To generate 5.2 GHz I and Q signals, the oscillator described by Lam et al. must oscillate controllably at a minimum frequency of 5.2 GHz. Existing cost-effective integrated circuit process technologies cannot provide high quality (i.e. low loss) inductors on-chip, as would be required in such a circuit. This circuit would have a poor phase noise due to inductive losses. It is preferable to generate a spectrally pure signal at a lower frequency and then multiply this frequency to provide the necessary high frequency needed to generate the desired I and Q signals.

U.S. Pat. No. 5,815,014 to Zhang et al. discloses a frequency multiplier circuit in which the frequency of an output signal is a multiple of the frequency of an input signal. This circuit has a single ended output that is referenced to ground. When implemented in an integrated circuit, this may result in substrate noise coupling, reducing the quality of the output signal. It is preferable to have a differential output signal rather than the single ended signal provided here.

In many radio communication operations, it is necessary to have a pair of differential quadrature signals. U.S. Pat. No. 5,389,886 to Popescu describes a system for receiving a pair of quadrature signals at a first frequency and providing a pair of output signals having a frequency double that of the input signals. A quadrature input signal pair may not be available in a particular application, and so it is preferable that a frequency multiplier provide a quadrature signal, or a pair of quadrature signals, utilizing only a single ended input signal or a single differential input signal.

Accordingly, there is a need for a frequency multiplier capable of providing an output signal with a frequency on the order of 10–14 GHz or higher, which has a precisely controllable frequency and which provides a differential output signal. It is desirable that the frequency multiplier be capable of operating with only a single ended input signal or with a single differential input signal to produce a pair of differential quadrature output signals. It is also desirable that the output signal have a gain that is independent of the input signal level, allowing a relatively low level input signal to be used to generate an output signal with an acceptable power level. It is also desirable that the output is a low impedance source so that a larger proportion of the power of the output signal can be transferred to a load which receives the output signal.

BRIEF SUMMARY OF THE INVENTION

The present invention provides a circuit for receiving an input signal having an input frequency $f_{in}$ to produce a differential output signal having a frequency $f_{out}$ double that of the input frequency $f_{in}$.

In one aspect, the present invention comprises a frequency multiplying circuit, said circuit comprising: an input node for receiving an input signal having a first frequency; a oscillator circuit coupled to said input node for producing first and second differential signals having an oscillation frequency equal to said first frequency; an injection coupling circuit coupled between said input node and said oscillator circuit for injection locking said oscillation circuit such that said oscillation frequency is equal to said first frequency; first and second output nodes coupled to said oscillator for providing an output signal having a second frequency, wherein said second frequency is a multiple of said first frequency.

BRIEF DESCRIPTION OF THE DRAWINGS

Several preferred embodiments of the present invention will now be explained in detail with reference to the drawings, in which:

FIG. 4 illustrates an input signal received by the circuit of FIG. 3;

FIG. 5 illustrates the signals at a pair of nodes $I^+$ and $I_-$ of the circuit of FIG. 3;

FIG. 6 illustrates the signals at a pair of nodes $Q_+$ and $Q_-$ of the circuit of FIG. 3;

FIGS. 7A and 7B illustrate output signal $V_{out+}$ and $V_{out-}$ of the circuit of FIG. 3, when the circuit is operated at a relatively low frequency;

FIGS. 8A and 8B illustrate output signal $V_{out+}$ and $V_{out-}$ of the circuit of FIG. 3 when the circuit is operated at a relatively high frequency;

DETAILED DESCRIPTION OF THE PREFERRED EMBODIMENTS

Figure 1:
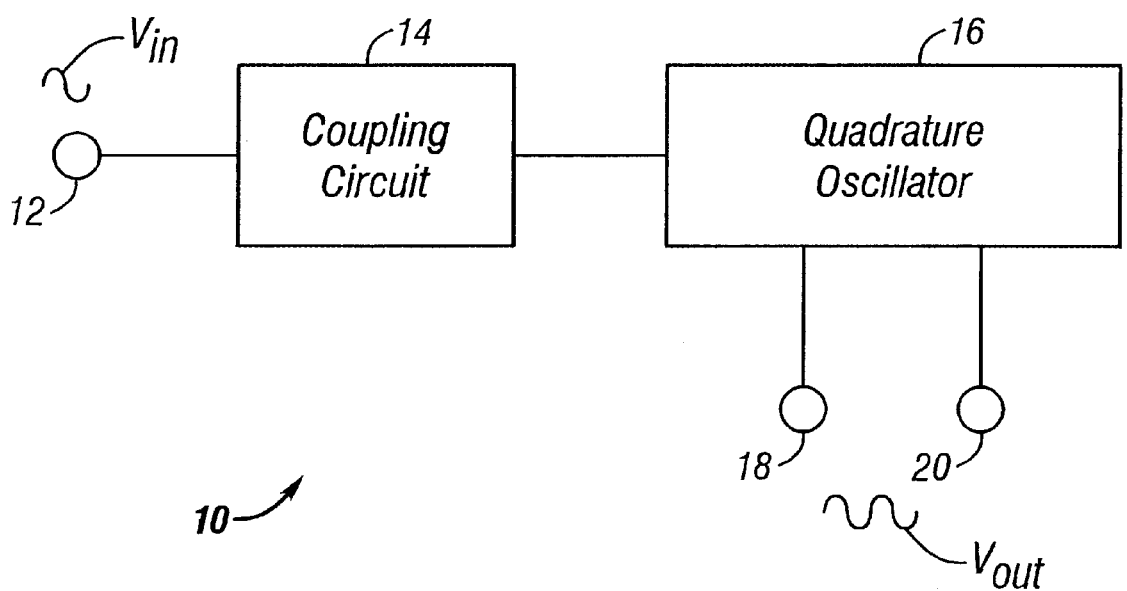
FIG. 1 is a block diagram of a first preferred embodiment of a circuit according to the present invention.

Reference is first made to FIG. 1, which shows a block diagram of a frequency multiplying circuit 10 according to the present invention. Circuit 10 includes an input node 12 for receiving an input signal $V_{in}$ having an input frequency $f_{in}$, a coupling circuit 14, a quadrature oscillator 16 and output nodes 18, 20 for providing an output signal $V_{out}$ having an output frequency $f_{out}$ which is a multiple of the input frequency (i.e. $f_{out} = nf_{in}$, where n is an integer).

Figure 2:
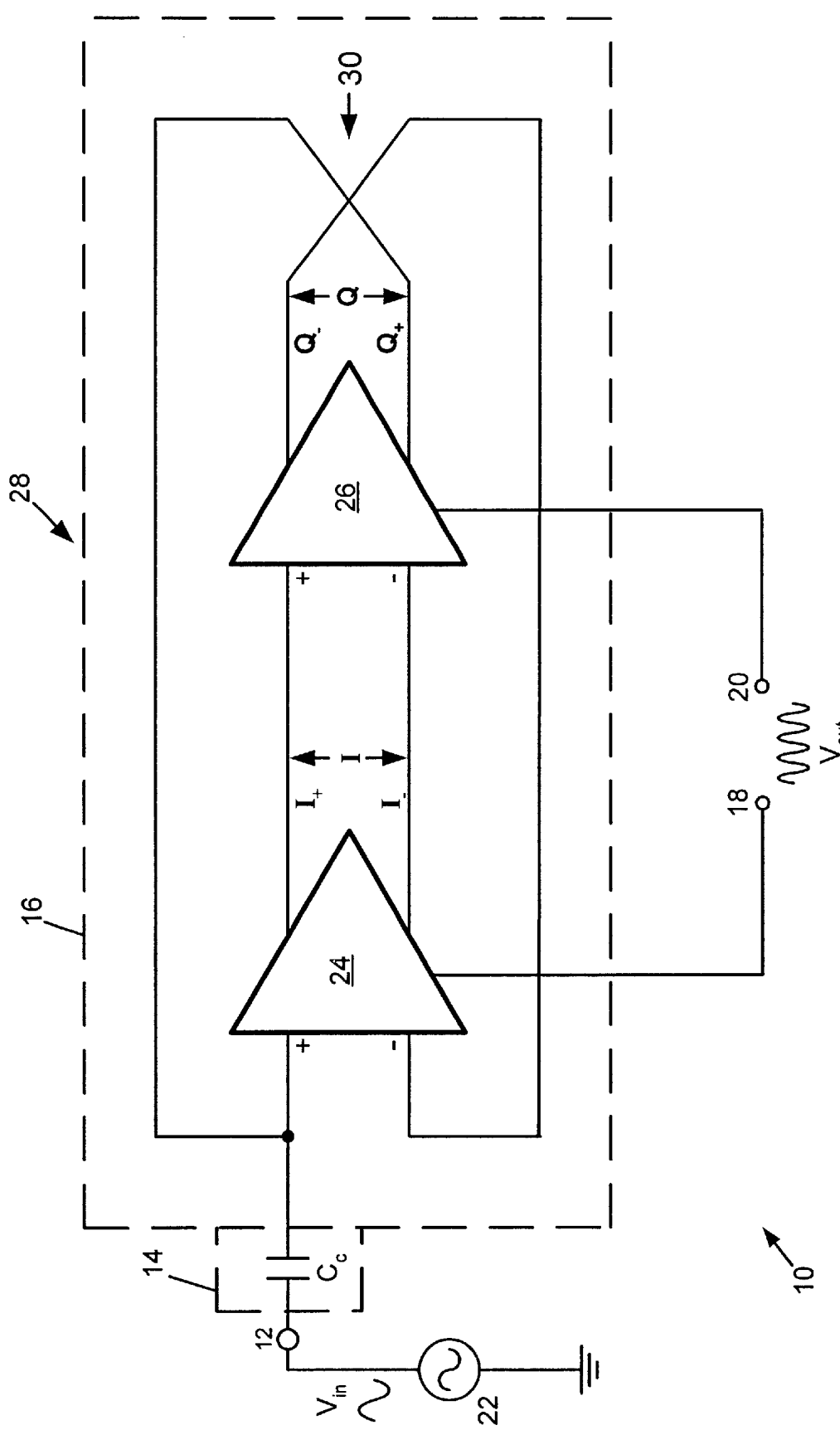
FIG. 2 is a second more detailed block diagram of the circuit of FIG. 1.

FIG. 2 shows a more detailed block diagram of circuit 10. An alternating current signal generator 22 is coupled to input node 12. Signal generator 22 generates input signal $V_{in}$. Coupling circuit 14 comprises a capacitor $C_c$. Quadrature oscillator 16 comprises two inverting differential amplifiers 24, 26. Differential amplifiers 24, 26 are connected as a two-stage differential ring oscillator 28. The differential output of amplifier 24 at nodes $I_+$, $I_-$ is connected to the differential inputs of amplifier 26. The differential output of amplifier 26 at nodes $Q_+$, $Q_-$ is cross-coupled to the differential inputs of amplifier 24. Differential amplifiers 24, 26 are configured to have an equal signal propagation delay $t_d$. The cross-coupling of the output of amplifier 26 provides a third inverter 30 in the ring oscillator 28. Inverter 30 will have no time delay but will produce a 180° phase shift in the propagated signal. The remaining 180° of phase shift around the propagation loop of ring oscillator 28 is equally divided between the two differential amplifiers 24, 26. As a result, amplifiers 24 and 26 operate as 90° phase shifters. The phase of the propagated signal at node $I_+$ is selected to be 0°. The resulting phases of the propagated signal at the following nodes of ring oscillator 28 will be:

| Node | Phase |
|---|---|
| $I_+$ | 0° |
| $Q_+$ | 90° |
| $I_-$ | 180° |
| $Q_-$ | 270° |

Nodes $I_+$ and $I_-$ provide an "inphase" signal I and nodes $Q_+$ and $Q_-$ provide a "quadrature" signal Q. Inphase signal I and quadrature signal Q have the same frequency as input signal $V_{in}$. Quadrature signal Q lags 90° behind inphase signal I. Inphase signal I is the input signal to amplifier 26 and quadrature signal Q is the input (after inversion through inverter 30) to amplifier 24. Differential amplifiers 24, 26 are also coupled to output nodes 18, 20 and provide differential output signal $V_{out}$ having a frequency $f_{out}$ which is a multiple n of the frequency $f_{in}$ of the input signal $V_{in}$.

Generally, a ring oscillator, such as ring oscillator 28 will oscillate at a "free-running" frequency which is dependent primarily on the combined propagation delay $2t_d$ of amplifiers 24, 26. In the preferred embodiment frequency multiplier circuit 10, input signal $V_{in}$ is capacitively coupled to the positive input of differential amplifier 24. Input signal $V_{in}$ is selected such that ring oscillator 28 becomes injection locked to the frequency $f_{in}$ of input signal $V_{in}$. The selection of the frequency $f_{in}$ and the amplitude of input signal $V_{in}$ is discussed in detail below. The frequency $f_{out}$ of the output signal $V_{out}$ can accordingly be controlled by controlling the frequency $f_{in}$ of the input signal $V_{in}$.

Figure 3:
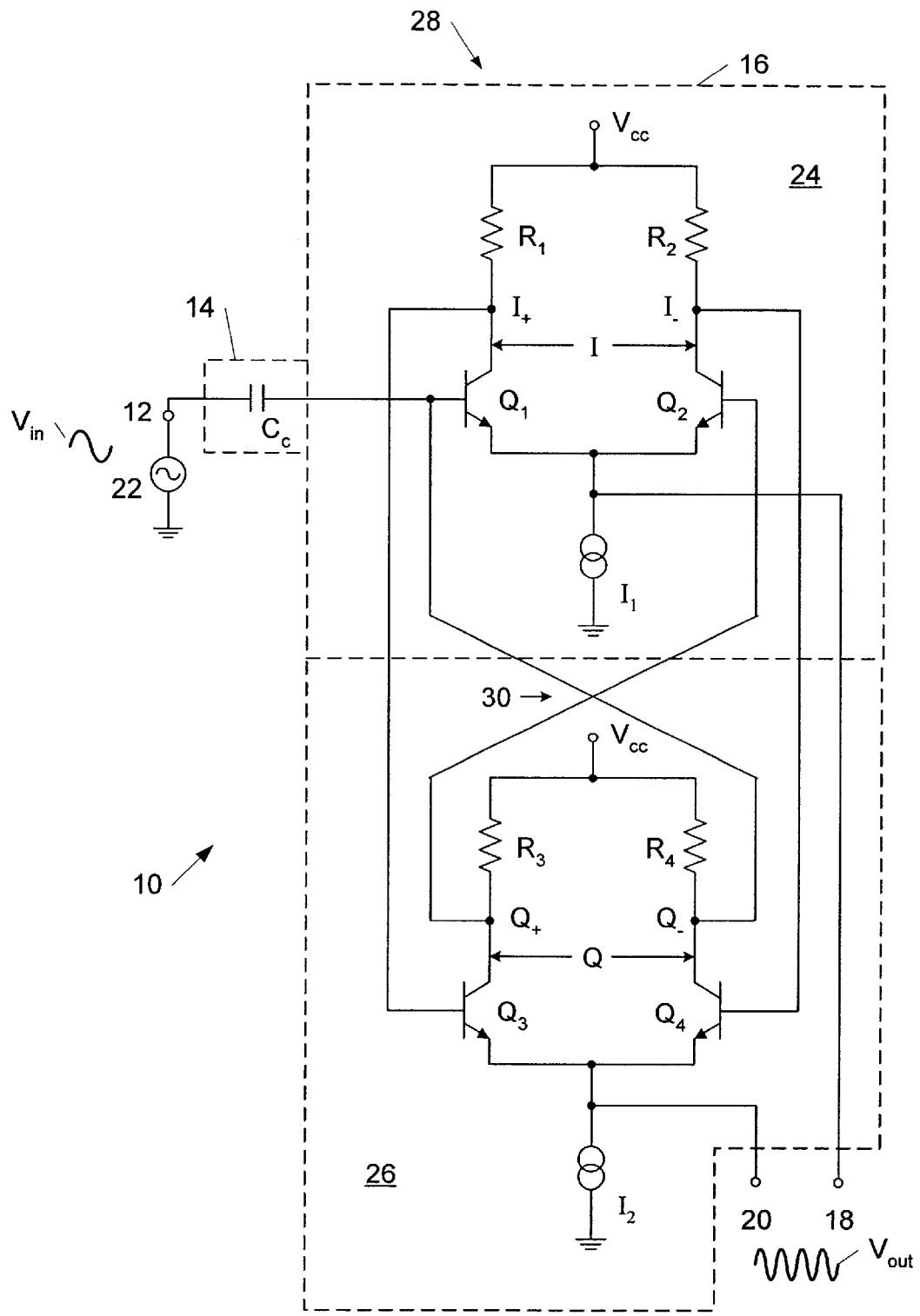
FIG. 3 is a schematic diagram of the circuit of FIG. 1.

FIG. 3 shows a schematic diagram of circuit 10.

Inverting differential amplifier 24 comprises a pair of emitter-coupled bipolar transistors $Q_1$ and $Q_2$, each of which has a collector output and a base input. The collectors of transistors $Q_1$ and $Q_2$ are coupled to a voltage supply $V_{cc}$ through resistors $R_1$ and $R_2$. respectively. The emitters of transistors $Q_1$ and $Q_2$ are coupled together and coupled to ground through a current source $I_1$. Similarly, inverting differential amplifier 26 comprises emitter-coupled transistors $Q_3$ and $Q_4$, each of which has a collector output and a base input. The collectors of transistors $Q_3$ and $Q_4$ are coupled to voltage supply $V_{cc}$ through resistors $R_3$ and $R_4$. The emitters of transistors $Q_3$ and $Q_4$ are coupled together and to ground through a current source $I_2$.

The base input of transistor $Q_3$ is coupled to the collector output of transistor $Q_1$ and the base input of transistor $Q_4$ is coupled to the collector output of transistor $Q_2$. The base input of transistor $Q_1$ is coupled to the collector output of transistor $Q_4$ and the base input of transistor $Q_2$ is coupled to the collector output of transistor $Q_3$, thereby providing inverter 30.

Differential amplifiers 24, 26 are configured to have an identical propagation delay $t_d$. In addition, differential amplifier 24 is configured such that inphase signal I (measured across nodes $I_+$ and $I_-$) is fully differential (i.e. nodes $I_+$ and $I_-$ have equal magnitude and opposite polarity). Similarly, differential amplifier 26 is configured such that quadrature signal Q (measured across node $Q_+$ and $Q_-$) is also fully differential. This is done by selecting $Q_1$, $Q_2$, $Q_3$ and Q4 such that their switching characteristics are identical; by selecting $R_1$, $R_2$, $R_3$ and $R_4$ to have equal resistances; and by selecting current sources $I_1$ and $I_2$ to have equal currents.

Signal generator 22 is coupled to the base input of transistor $Q_1$ through coupling capacitor $C_c$, thereby injecting input signal $V_{in}$ into the feedback path between the collector output of transistor $Q_4$ and the base input of transistor $Q_1$. As noted above, the frequency $f_{in}$ and amplitude of input signal $V_{in}$ are selected such that ring oscillator 28 becomes injection locked to the frequency $f_{in}$ of input signal $V_{in}$. In circuit 10, coupling capacitor $C_c$ is used to pass only AC components of input signal $V_{in}$ into ring oscillator 28. This ensures that only the AC signal which is required to injection lock ring oscillator 28 is passed.

Output node 18 is coupled to the emitters of transistors $Q_1$ and $Q_2$. Output node 20 is coupled to the emitters of transistors $Q_3$ and $Q_4$. Output signal $V_{out}$ consists of two single ended signals $V_{out+}$ (FIG. 7A) and $V_{out-}$ (FIG. 7B), which are provided, respectively, at nodes 18 and 20.

Reference is next made to FIGS. 4–8B, which illustrate the signals at various nodes of circuit 10. FIG. 4 illustrates the input signal $V_{in}$, which has a frequency $f_{in}$. FIG. 5 shows inphase signal I. Inphase signal I is a fully differential signal consisting of the single ended signals at nodes $I_+$ and $I_-$. FIG. 6 shows quadrature signal Q, which is a fully differential signal consisting of the single ended signals at nodes $Q_+$ and $Q_-$. As a result of the 90° phase shift of amplifier 26, signal Q lags 90° behind signal I.

The current drawn by current source $I_1$ will be alternately drawn through transistors $Q_1$ and $Q_2$ as the two transistors oscillate. As a result signal $V_{out+}$ at node 20 will correspond to the positive half cycles of the signals at nodes $I_+$ and $I_-$, as shown in FIG. 7A. Similarly, signal $V_{out-}$ at node 18 will correspond to the positive half cycles of the signals at nodes $Q_+$ and $Q_-$, as shown in FIG. 7B. Signal $V_{out+}$ consists primarily of frequency components that are multiples of the frequency $f_{in}$ of input signal $V_{in}$ (i.e. harmonics of the input frequency $f_{in}$). Generally, the strongest frequency component of signal $V_{out}$ will be the second harmonic, which has a frequency of $2f_{in}$. Higher harmonics will be present in progressively smaller magnitudes. The second harmonic frequency of signal $V_{out+}$ may be isolated by coupling a low pass filter (not shown) between the emitters of transistors $Q_1$ and $Q_2$ and output node 18. A higher harmonic frequency of signal $V_{out-}$ may be isolated by coupling a band pass filter (not shown) between the emitters of transistors $Q_1$ and $Q_2$ and node 18. The selection and use of such filters will be well known to those skilled in the art and is not described here. Signal $V_{out-}$ similarly consists primarily of frequency components that are harmonics of the frequency $f_{in}$ of the input signal $V_{in}$ and can similarly be filtered to provide a single harmonic component. If both single ended signals $V_{out+}$ and $V_{out-}$ are identically filtered to provide a selected harmonic frequency component, the output signal $V_{out}$ will be a fully differential signal with a frequency $f_{out}$ equal to the selected harmonic component. In this way, circuit 10 may be used to provide an output signal $V_{out}$ with a frequency $f_{out}$ that is a selected multiple of the frequency $f_{in}$ of the input signal $V_{in}$. FIGS. 8A and 8B illustrate the case in which filters (not shown) are used to eliminate all frequency components in signals $V_{out+}$ and $V_{out-}$ other than the second harmonic. The resulting output signal $V_{out}$ has a frequency $f_{out}$ equal to $2f_{in}$.

Circuit 10 is designed for use in high frequency communication systems, typically with an output frequency $f_{out}$ exceeding 10 GHz. If circuit 10 is operated at such a high frequency, the higher harmonic components of $V_{out+}$ and $V_{out-}$ are substantially filtered out by the parasitic capacitances of transistors $Q_1$–$Q_4$. In this case, the frequency spectrum of output signal $V_{out}$ consists almost entirely of the second harmonic component and output signal $V_{out}$ is as shown in FIGS. 8A and 8B.

Figure 9:
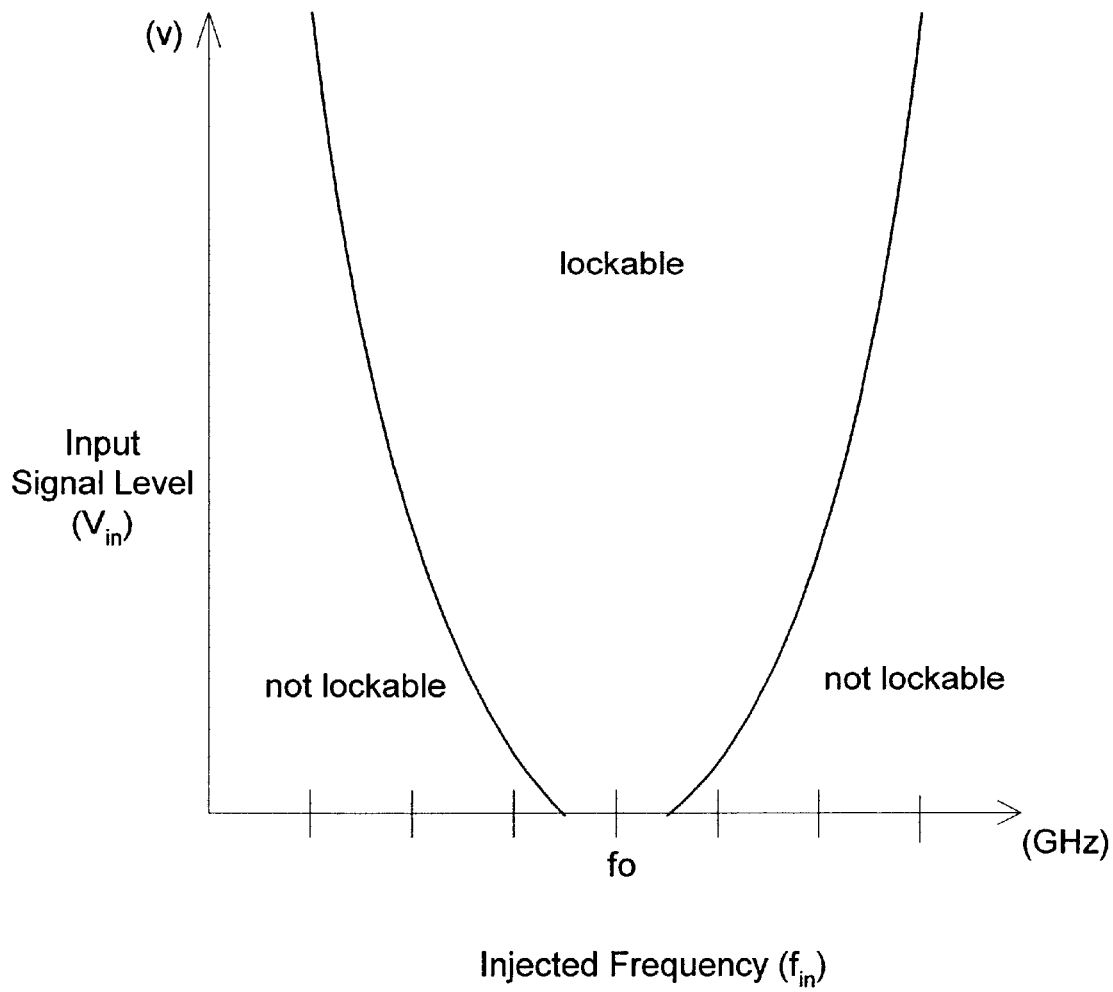
FIG. 9 is a graph illustrating the range of frequencies at which a ring oscillator of the circuit of FIG. 3 may be injection locked.

Reference is next made to FIG. 9, which illustrates the frequency range in which circuit 10 may be injection locked to the frequency $f_{in}$ of input signal $V_{in}$. The free-running frequency of ring oscillator 28 is $f_0$. Ring oscillator 28 may be injection locked at a range of frequencies generally centered about $f_0$ by injecting input signal $V_{in}$ to a node in any part of the feedback loop of ring oscillator 28, as is done in circuit 10 at the base input of transistor $Q_1$. The range of lockable frequencies increases as the magnitude of the input signal $V_{in}$ increases, however, it is necessary to design ring oscillator 28 such that its free running frequency is close to the input frequency $f_{in}$ of the input signal $V_{in}$.

The free-running frequency of a ring oscillator may be controlled by many techniques which will be known to those skilled in the art. Providing a mechanism to control the free-running frequency allows the range of operation of circuit 10 to be varied during operation, and thereby allows the difference between $f_{in}$ and the free-running frequency to be reduced. This has the benefit of allowing an input signal with a smaller amplitude to be used to injection lock the oscillator. In addition, the effect of a phase difference between input signal $V_{in}$ and the free-running frequency, which can alter the phase relationship between the I and Q signals, can be reduced.

In one implementation of the preferred embodiment of circuit 10, ring oscillator 28 has a free running frequency $f_0$ of approximately 6 GHz. It has been found that, in this implementation, ring oscillator 28 may be injection locked to a frequency between 5 GHz and 7 Ghz, using a injected signal $V_{in}$ with an amplitude of 300 mV or less. The resulting output signal has a frequency between 10 GHz and 14 GHz and may be used to generate I and Q signals between 5 GHz and 7 Ghz.

Circuit 10 provides a number of advantages. First, the oscillation frequency of ring oscillator 28 can be injection locked to the frequency $f_{in}$ of a single ended input signal $V_{in}$ over a relatively broad range of frequencies. As a result, the oscillation frequency of ring oscillator 28 will not vary if the input frequency $f_{in}$ does not vary. Circuit 10 provides a fully differential output signal having a frequency $f_{out}$ which is a multiple of $f_{in}$. Second, an injection locked oscillator preserves the spectral purity (or phase noise) of the input signal to which it is locked. If the input signal $V_{in}$ has a high spectral purity (i.e. low phase noise), then the output signal $V_{out}$ will have corresponding high spectral purity. Third, output signal $V_{out}$ is provided at the coupled emitters of transistors $Q_1$–$Q_4$. The emitters of transistors $Q_1$–$Q_4$ are acting essentially as emitter followers, and accordingly, the output impedance of signal $V_{out}$ will be low. As a result, the power of output signal $V_{out}$ can be transferred efficiently to a load which does not have a large input impedance. Fourth, the voltage level of output signal $V_{out}$ is relatively independent of the voltage level of the input signal. The voltage swing at nodes 18 and 20 will depend on the current of current sources $I_1$ and $I_2$, the collector-emitter voltage drop $V_{CE}$ of transistors $Q_1$–$Q_4$ the resistances of resistors $R_1$–$R_4$ and the voltage of voltage source $V_{cc}$. These values may be selected to control the voltage of output signal $V_{out}$ so that it is sufficient to drive a load connected to output nodes 18 and 20. The maximum power level which may be delivered at the output nodes is dependent on the power dissipation of circuit 10, the frequency $f_{out}$ of the output signal $V_{out}$ and the unity gain frequency ($f_T$) of the process by which circuit 10 is implemented. In one implementation of circuit 10 utilizing a silicon bipolar process with an $f_T$ of 25 GHz and with a supply voltage $V_{cc}$ of 2.2 volts, it has been found that an output level of 80 millivolts peak-to-peak can be obtained with an output frequency $f_{out}$ of 13.6 GHz ($f_T/1.84$). This output level is sufficient to drive an I and Q signal generator (i.e. a frequency divide-by-2 signal generative) to produce I and Q signal with a frequency of 6.8 Ghz ($f_T/3.68$).

The relative phases of signals I and Q may become shifted by unequal loading at any feedback within ring oscillator 28. For example, injection locking signal $V_{in}$ at a frequency different from the free-running frequency of ring oscillator 28 will affect the phase relationship between the I and Q signals such that they are separated by more or less than 90°. To compensate for this phase error, the propagation delays of one or both of amplifiers 24 and 26 may be adjusted so that the phase difference is 90°. One method of accomplishing is to adjust the currents of one or both of current sources $I_1$ or $I_2$. Another method is to insert loads at one or more nodes of the feedback loop of of ring oscillator 28. Other methods of adjusting the propagation delays of amplifiers 24 and 26 will be known to persons skilled in the art.

Figure 10:
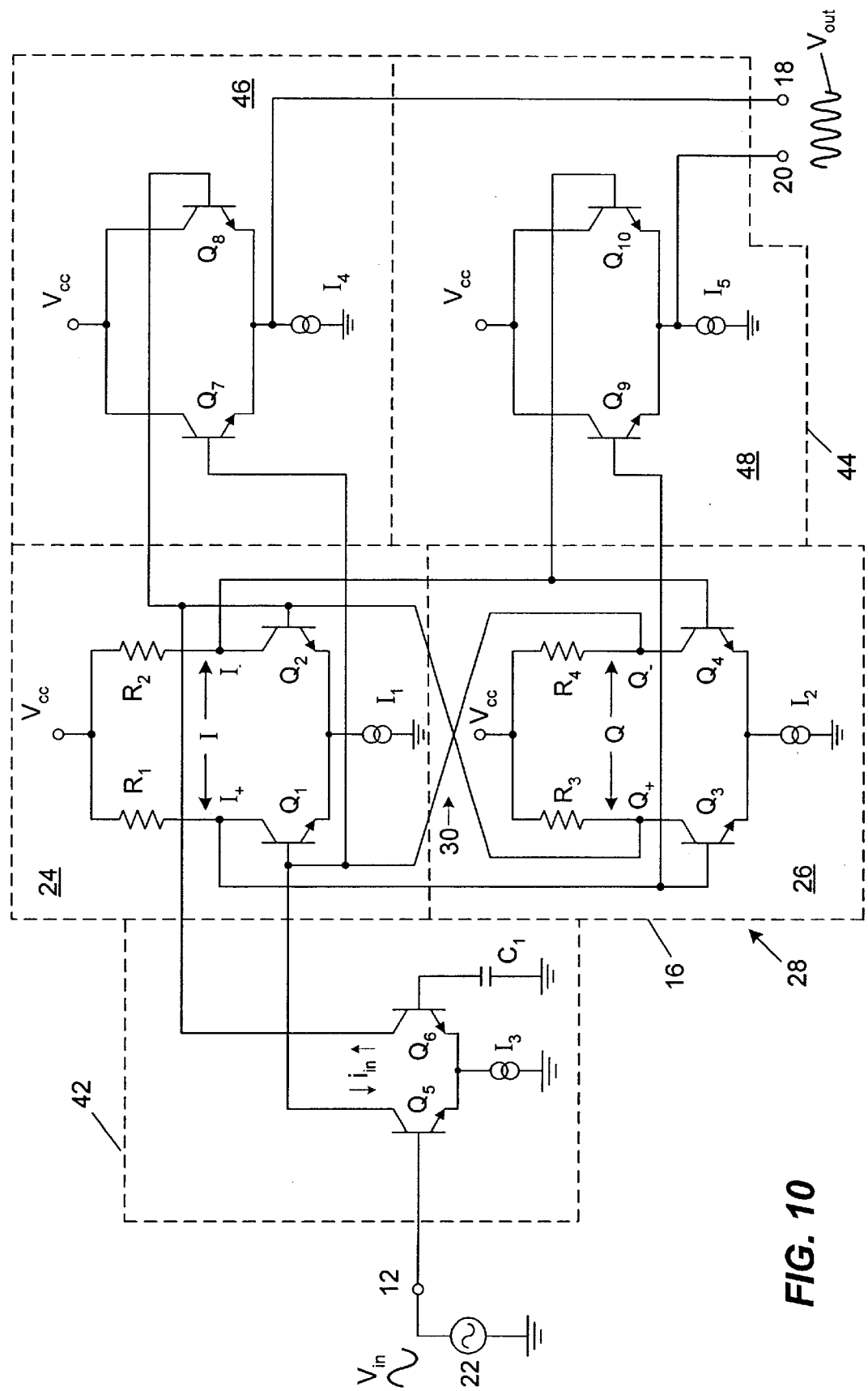
FIG. 10 is a schematic diagram of a second preferred embodiment of a circuit according to the present invention.

Reference is next made to FIG. 10, which shows a schematic diagram of a second preferred embodiment of a circuit 40 according to the present invention. Components of circuit 40 that are identical to those of circuit 10 (FIG. 3) are denoted by the same reference numerals. Circuit 40 comprises an input node 12, a coupling circuit 42, a quadrature oscillator 16, an output circuit 44 and output nodes 18, 20.

Input node 12 is coupled to a signal generator 22, which provides an input signal $V_{in}$ having an input frequency $f_{in}$, as in the case of circuit 10. Coupling circuit 14 of circuit 10 has been replaced with coupling circuit 42 in circuit 40. Coupling circuit 42 comprises a pair of emitter-coupled transistors $Q_5$ and $Q_6$. The emitters of transistors $Q_5$ and $Q_6$ are coupled to ground through current source $I_3$. The base of transistor $Q_6$ is coupled to ground through a capacitor $C_1$. The collectors of transistors $Q_5$ and $Q_6$ are respectively coupled to the base inputs of transistors $Q_1$ and $Q_2$, which are part of differential inverter 24, as in circuit 10. Input signal $V_{in}$ is coupled to the base of transistor $Q_5$. Transistors $Q_5$ and $Q_6$ oscillate in response to the oscillation of input signal $V_{in}$ and convert the single ended input signal $V_{in}$ into a differential current signal $i_{in}$ across the collectors of transistors $Q_5$ and $Q_6$. Current signal $i_{in}$ has the same frequency $f_{in}$ as input signal $V_{in}$. Current signal $i_{in}$ is injected into the base input nodes of transistors $Q_1$ and $Q_2$, thereby injection locking ring oscillator 28 to the frequency $f_{in}$ of input signal $V_{in}$.

Coupling circuit 42 may be the output of an amplifier or other element which processes or provides input signal $V_{in}$ or a corresponding input current $i_{in}$. If input signal $V_{in}$ generated by signal generator 22 does not require any processing, it may be injected directly into a feedback path of oscillator 28. In this case, it is preferable that input signal $V_{in}$ have no DC offset relative to the node to which it is being coupled to avoid affecting the operation of ring oscillator 28.

Output circuit 44 comprises a pair of output buffers 46 and 48. Output buffer 46 comprises a pair of emitter coupled transistors $Q_7$ and $Q_8$. The collectors of transistors $Q_7$ and $Q_8$ are coupled to voltage source $V_{cc}$. The emitters of transistors are coupled to ground through a current source $I_4$. The bases of transistors $Q_7$ and $Q_8$ are respectively coupled to the bases of transistors $Q_1$ and $Q_2$, and as a result, transistors $Q_7$ and $Q_8$ switch in synchronization with transistors $Q_1$ and $Q_2$. Output node 18, which provides signal $V_{out+}$, is coupled to the emitters of transistors $Q_7$ and $Q_8$.

Output buffer 48 is comprised of emitter coupled transistors $Q_9$, $Q_{10}$ and current source $I_5$ and is configured in the same way as output buffer 46. The bases of transistors $Q_9$ and $Q_{10}$ are respectively coupled to the bases of transistors $Q_3$ and $Q_4$ and therefore switch synchronously with transistors $Q_3$ and $Q_4$. Output node 20, which provides signal $V_{out-}$ is coupled to the emitters of transistors $Q_9$ and $Q_{10}$.

As in circuit 10, output signal $V_{out}$ is a fully differential signal consisting of the single ended signals $V_{out+}$ and $V_{out-}$ at nodes 18, 20 and has a frequency $f_{out}$ that is a multiple of the frequency $f_{in}$ of the input signal $V_{in}$. As in the case of circuit 10, if circuit 40 is operated at a high frequency, output signal $V_{out}$ will have a frequency equal to $2f_{in}$.

The use of output stage 44 has several advantages. First, output nodes 18 and 20 are isolated from ring oscillator 28 through the base-emitter junctions of transistors $Q_7$-$Q_{10}$. This ensures that signals from a load connected at nodes 18 and 20 do not affect the oscillation of ring oscillator 28. Output stage 44 does have the disadvantage that it loads the collector outputs of transistors $Q_1$-$Q_4$ thereby reducing the free-running frequency of the ring oscillator 28 and potentially requiring a higher level input signal to injection lock the oscillator.

Figure 11:
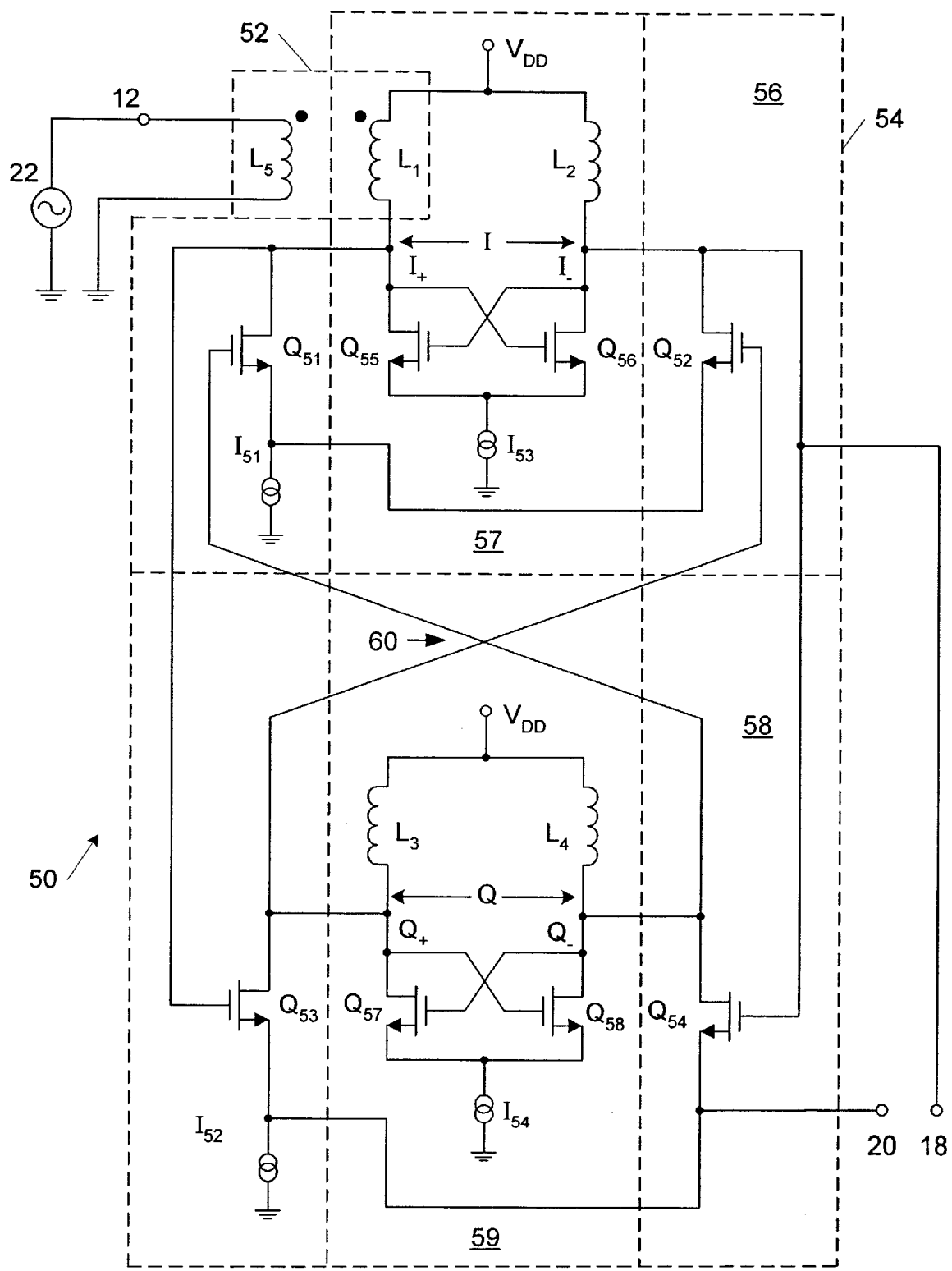
FIG. 11 is a schematic diagram of a third preferred embodiment of a circuit according to the present invention.

Reference is next made to FIG. 11, which shows a third preferred embodiment of a circuit 50 implemented according to the present invention. Circuit 50 is implemented using CMOS transistors. Circuit 50 includes an input node 12, a coupling circuit 52, a quadrature coupled oscillator 54 and output nodes 18, 20.

Quadrature coupled oscillator 54 comprises oscillation stages 56 and 58. Stage 56 comprises differential oscillator 57. Differential oscillator 57 comprises transistors $Q_{55}$ and $Q_{56}$. The sources of transistors $Q_{55}$ and $Q_{56}$ are coupled together and to ground through a current source $I_{53}$. The gates and drains of transistors $Q_{55}$ and $Q_{56}$ are cross-coupled. The drain of transistor $Q_{55}$ is coupled to a voltage source $V_{DD}$ through an inductor $L_1$. The drain of transistor $Q_{56}$ is coupled to voltage source $V_{DD}$ through an inductor $L_2$. Stage 56 also comprises transistors $Q_{51}$ and $Q_{52}$. The drains of transistors $Q_{51}$ and $Q_{52}$ are respectively coupled to the drains of transistors $Q_{55}$ and $Q_{56}$. The sources of transistors $Q_{51}$ and $Q_{52}$ are coupled together and to ground through current source $I_{51}$.

Stage 58 comprises differential oscillator 59. Differential oscillator 59 comprises transistors $Q_{57}$ and $Q_{58}$, inductors $L_3$ and $L_4$ and current source $I_{54}$ and is identical in structure to differential oscillator 57. Differential oscillator 59 also comprises transistors $Q_{53}$ and $Q_{54}$. The drains of transistors $Q_{53}$ and $Q_{54}$ are coupled to the drains of transistors $Q_{57}$ and $Q_{58}$. The sources of transistors $Q_{53}$ and $Q_{54}$ are coupled together and to ground through current source $I_{52}$.

The drains of transistors $Q_{51}$ and $Q_{52}$ are coupled to the gates of transistors $Q_{53}$ and $Q_{54}$, respectively. The drains of transistors $Q_{53}$ and $Q_{54}$ are cross-coupled to the gates of transistors $Q_{51}$ and $Q_{52}$, respectively. Transistors $Q_{51}$ and $Q_{52}$ act as an inverting phase shifter. Transistors $Q_{53}$ and $Q_{54}$ act as a second inverting phase shifter. The cross coupling between the drains of transistors $Q_{53}$ and $Q_{54}$ and the gates of transistors $Q_{51}$ and $Q_{52}$ create a third inverter 60. Stage 56, 58 and inverter 60 form a ring oscillator. If node $I_+$ is selected as having a phase of 0°, then the phases of $I_-$, $Q_+$ and $Q_-$ are identical to those of circuit 10.

Output node 18 is coupled to the emitters of transistors $Q_{51}$ and $Q_{52}$. Output node 20 is coupled to the emitters of transistors $Q_{53}$ and $Q_{54}$.

Oscillators 57 and 59 are oscillators independent of other components of circuit 50. Oscillators 57 and 59 are coupled together through transistor $Q_{51}$-$Q_{54}$. The effect of this coupling is to injection lock oscillators 57 and 59 to each other so that their oscillation frequency will be the same.

Coupling circuit 52 comprises inductors $L_5$ and $L_1$ (which is also part of oscillator 57). Input signal $V_{in}$ is inductively coupled into the feedback path between the drain output transistor $Q_{51}$ and the gate input of transistor $Q_{53}$. Alternatively, an additional inductor could be inserted between the drain of transistor $Q_{51}$ and the gate input of transistor $Q_{53}$ to achieve the same result. Similarly, input signal $V_{in}$ could also be coupled to any feedback node of circuit 50.

The oscillation frequency of oscillators 57 and 59 is injection locked to the input frequency $f_{in}$ in this way. Signal $V_{out+}$ at node 18 corresponds to the positive half cycles of the signals at the gates of transistors $Q_{51}$ and $Q_{52}$. Similarly signal $V_{out-}$ at node 20 corresponds to the positive half cycles of the signals at the gates of transistors $Q_{53}$ and $Q_{54}$. The output signal $V_{out}$ of circuit 50 is similar to the output signal $V_{out}$ of circuit 10 (FIG. 3) as shown in FIGS. 7 and 8.

Circuit 50 may be used when the present invention is to be used in a CMOS environment. Coupling circuit 52 may reduce the free-running frequency of circuit 50. Cross-coupled BJT transistors configured in the same way as transistors $Q_{55}$ and $Q_{56}$ may be used in the differential amplifiers 24 and 26 of circuit 10 to provide increased instability and higher output levels at the collectors of the respective circuits. The magnetic injection coupling circuit 52 of circuit 50 may also be used with circuits 10 and 40 in place of coupling circuits 14 and 42. In addition, inductive loads $L_1$-$L_4$ may also be used in circuit 10 and 40.

Figure 12:
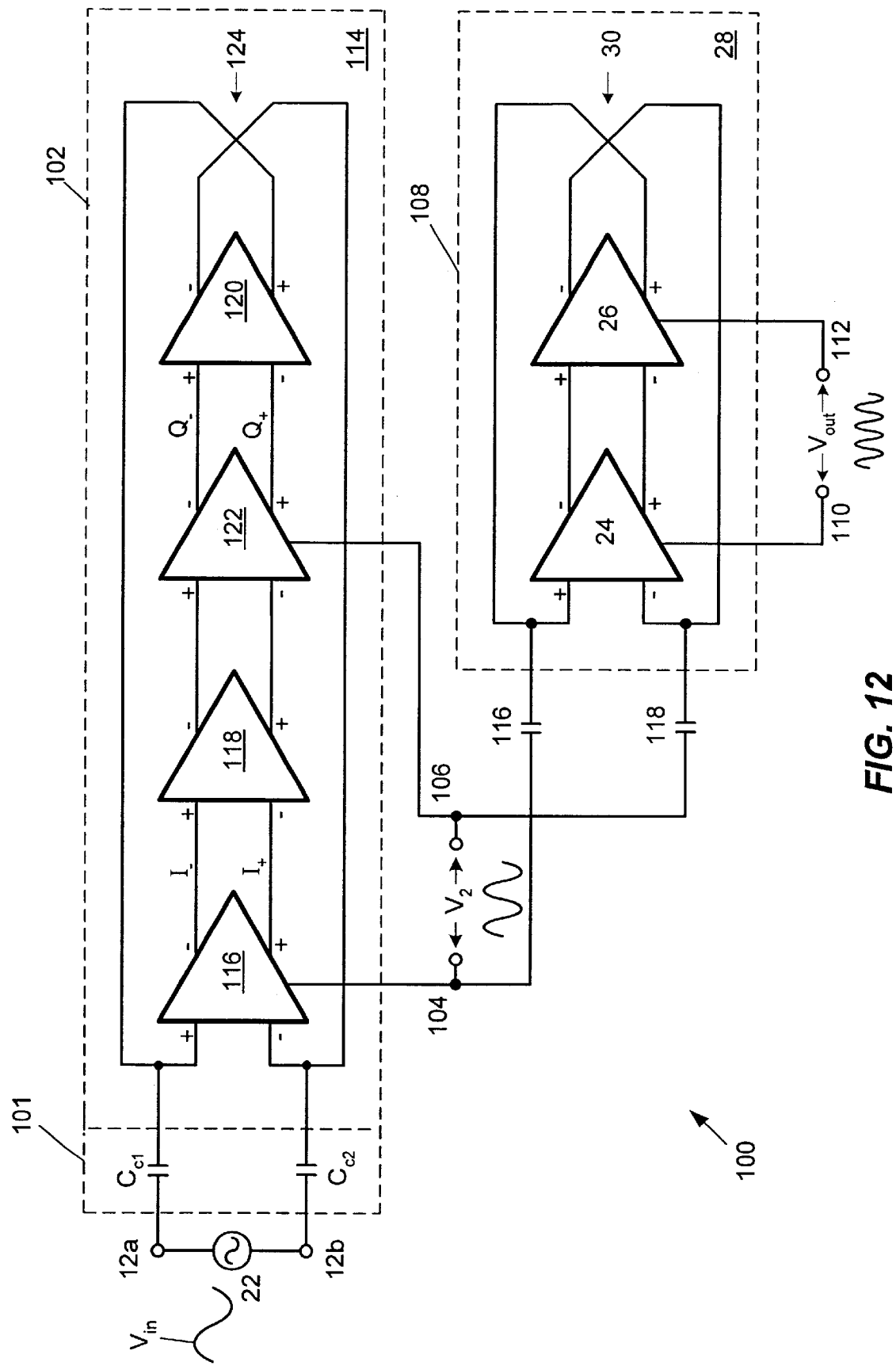
FIG. 12 is a schematic diagram of a fourth preferred embodiment of a circuit according to the present invention.

Reference is next made to FIG. 12, which illustrates a frequency quadrupling circuit 100. Circuit 100 comprises a signal generator 22, input nodes 12a, 12b, frequency doubler 102, nodes 104, 106, frequency doubler 108 and output nodes 110, 112.

Frequency doubler 102 comprises a ring oscillator 114 comprised of inverting differential amplifiers 116, 118, 120 and 122. A fifth inverter 124 is created by crossing the coupling between the positive and negative outputs of inverter 122 and the positive and negative inputs of inverter 116. Inverter 95 will have no time delay but will produce a 180° phase shift in the signal propagated in ring oscillator 102. Amplifiers 116, 118, 120 and 122 are configured to have the same switching time and propagation delay. As a result, amplifiers 116, 118, 120 and 122 each provide an equal phase shift of 45°. If node $I_+$ is selected to have a phase of 0°, then the phases at nodes $I_-$, $Q_+$ and $Q_-$ will be the same as in circuit 10. Signal Q lags behind signal I by 90°. Each of amplifiers 116, 118, 120 and 122 is identical in structure to amplifier 24 of circuit 10 (FIG. 3). A high frequency signal (i.e. a signal comprised primarily of frequency components that are harmonics of the input frequency $f_{in}$) may be extracted from the emitters of the emitter-coupled pair of transistors (not shown).

Signal generator 22 provides a fully differential input signal $V_{in}$ having a frequency $f_{in}$. Input signal $V_{in}$ is injected into ring oscillator 114 through coupling capacitors $Cc_1$ and $Cc_2$. One end of differential signal $V_{in}$ is injected into the feedback path between the positive output of amplifier 122 and the positive input of amplifier 116 through capacitor $Cc_1$. The other end of differential signal $V_{in}$ is injected into the feedback path between the negative output of amplifier 122 and the negative input of amplifier 116 through capacitor $Cc_2$. In this way, the oscillation frequency of ring oscillator 114 is injection locked to the frequency $f_{in}$ of input signal $V_{in}$.

Figure 13:
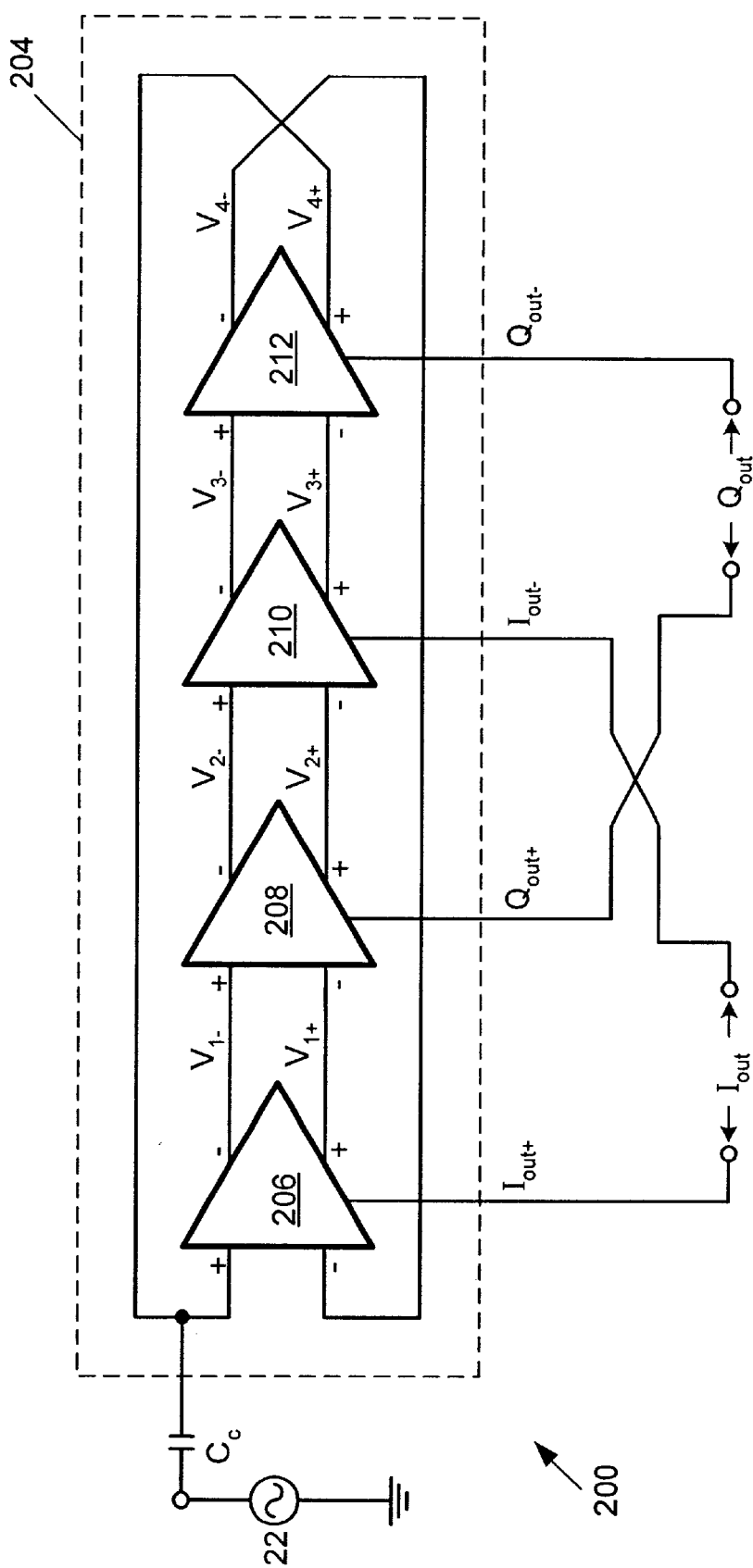
FIG. 13 is a schematic diagram of a fifth preferred embodiment of a circuit according to the present invention.

Coupling circuit 101 can be used to inject differential input signal $V_{in}$ into any corresponding pair of nodes in the feedback loop (i.e. $I_+$ and $I_-$ form a corresponding pair of nodes). Differentially coupling input signal $V_{in}$ into a ring oscillator such as ring oscillator 102 has several advantages. First, the mode of coupling corresponds to the mode of oscillation (i.e. both are differential). This decreases the phase error caused by non-symmetric coupling as in circuit 10 and suppresses unwanted common-mode signals from entering the oscillator. Second, a wider injection-locking bandwidth may be achieved using the same input signal $V_{in}$. Coupling circuit 101 may be used with circuits, 10 (FIG. 3), 40 (FIG. 10) and 50 (FIG. 11) and circuit 200 (FIG. 13).

The oscillation frequency of ring oscillator 114 is selected such that signal $V_2$ consists primarily of the second harmonic of the input frequency $V_{in}$. Alternatively, a low pass filter (not shown) may be used to eliminate the third and higher harmonic frequencies from signal $V_2$.

Node 104 is coupled to the emitters of the transistors (not shown) of amplifier 116. Node 106 is coupled to the emitters of the transistors (not shown) of amplifier 120. This provides a signal $V_2$ across nodes 104, 106. Signal $V_2$ is a fully differential signal with a frequency $f_2$ double that of input signal $V_{in}$ (i.e. $f_2=2f_{in}$).

Frequency doubler 108 comprises ring oscillator 28 and output nodes 110, 112. Ring oscillator 28 is identical to the corresponding element of circuit 10 (FIG. 3) and operates in an identical manner to provide an output signal $V_{out}$ at nodes 110, 112. Signal $V_2$ is injection coupled into ring oscillator 28 through capacitors 116 and 118. Output signal $V_{out}$ has a frequency $f_{out}$ which is double the frequency $f_2$ of signal $V_2$, and therefore four times the frequency $f_{in}$ of input signal $V_{in}$ (i.e. $f_{out}=4f_{in}$).

As discussed above and as shown in FIG. 9, a ring oscillator may be injection locked to a frequency within a limited range of the free running frequency of the ring oscillator. Ring oscillator 114 is designed to have a free running frequency approximately equal to the frequency $f_{in}$ of input signal $V_{in}$. Ring oscillator 28 (when used in cascade configuration with ring oscillator 114, as in frequency quadruplet 100) is designed to have a free running frequency equal to twice the frequency $f_{in}$ of input signal $V_{in}$. In this way, ring oscillator 114 can be injection locked at $f_{in}$ and ring oscillator 28 can be injection locked at $2f_{in}$, providing an output signal $V_{out}$ with a frequency $f_{out}$ that is precisely equal to $4f_{in}$.

In circuit 100, ring oscillator 114 has four differential amplifiers 116, 118, 120 and 122 which are identical to the two differential amplifiers 24 and 26 that make up ring oscillator 28. Each of the six amplifiers 116, 118, 120, 122, 24 and 26 has an identical propagation delay, with the result that the total propagation delay in the propagation loop of ring oscillator 83 is twice the total propagation delay in the propagation loop of ring oscillator 28. This results in ring oscillator 28 having a free running frequency twice that of ring oscillator 83, as required.

Reference is next made to FIG. 13, which shows another preferred embodiment of a frequency multiplying circuit 200 according to the present invention. Circuit 200 is configured to provide a quadrature differential output signal pair $I_{out}$, $Q_{out}$, each having a frequency $f_{out}$ double the frequency $f_{in}$ of an input signal $V_{in}$.

Circuit 200 comprises input nodes 12a and 12b, coupling circuit 14, ring oscillator 204 and output nodes $I_{out+}$, $I_{out-}$, $Q_{out+}$ and $Q_{out-}$.

Ring oscillator 204 comprises four inverting differential amplifiers 206, 208, 210 and 212, which are coupled to together in a closed loop in the same manner as ring oscillator 114 of circuit 100. Each of differential amplifiers 216, 208, 210 and 212 includes an emitter-coupled pair of transistors (not shown) and a high frequency signal may be extracted from the emitters of the transistors. The positive and negative outputs of amplifier 212 are cross-coupled to the positive and negative inputs of inverter 206 to provide a fifth inverter 214. If the signal at node $V_{1+}$ is selected to have a phase of 0°, then the phase of the following nodes in ring oscillator 204 will be:

| Node | Phase |
|---|---|
| $V_{1+}$ | 0° |
| $V_{2+}$ | 45° |
| $V_{3+}$ | 90° |
| $V_{4+}$ | 135° |
| $V_{1-}$ | 180° |
| $V_{2-}$ | 220° |
| $V_{3-}$ | 270° |
| $V_{4-}$ | 315° |

Signal $V_3$ lags 90° behind signal $V_1$ and signal $V_4$ lags 90° behind signal $V_2$.

Signal generator 22 provides a signal $V_{in}$ having a frequency $f_{in}$. Signal $V_{in}$ is injected into ring oscillator 204 through coupling circuit 14 (which comprises capacitor Cc) thereby injection locking the oscillation frequency of ring oscillator 204 to $f_{in}$.

Nodes $I_{out+}$ and $I_{out-}$ are respectively coupled to the emitters (not shown) of the transistors (not shown) of amplifiers 206 and 210. The signal at node $I_{out+}$ has a frequency $f_{out}$ that is twice the input frequency $f_{in}$. The signal at node $I_{out-}$ has the same frequency as the signal at node $I_{out+}$, but is opposite in phase. Thus, the signal $I_{out}$, measured across nodes $I_{out+}$ and $I_{out-}$ is a differential signal with a frequency $f_{out}$ twice that of the input frequency $f_{in}$.

Signals $V_2$ and $V_4$, respectively, lag 90° behind signal $V_1$ and $V_3$. Nodes $Q_{out+}$ and $Q_{out-}$ receive signals from the emitters (not shown) of the transistors (not shown) of amplifiers 208 and 212. Signal $Q_{out}$, measured across across nodes $Q_{out+}$ and $Q_{out-}$, is a differential signal with a frequency $f_{out}$ but lagging 90° behind output signal $I_{out}$.

The input frequency $f_{in}$ and the free running frequency of oscillator 204 are selected so that signals $I_{out}$ and $Q_{out}$ consist primarily of the second harmonic of the input frequency $f_{in}$. In this way, a pair of differential quadrature output signals $I_{out}$ and $Q_{out}$ having a frequency $f_{out}$ double the frequency $f_{in}$ of the input signal $V_{in}$ are provided. The pair of differential quadrature output signals $I_{out}$ and $Q_{out}$ are generated from a single ended input signal $V_{in}$. Quadrature output signals Iout and Qout may be multiplied together by various well known means to provide an overall multiply-by-four function.

The present invention has been explained here by way of example only. One skilled in the art will be capable of combining the different coupling circuits and oscillators to provide a frequency multiplier or frequency doubler suitable for various applications. Such variations fall within the scope of the invention, which is limited only by the appended claims.

I claim:

1. A frequency multiplying circuit, said circuit comprising:
    (a) an input node for receiving an input signal having a first frequency;
    (b) a oscillator circuit coupled to said input node for producing first and second differential signals having an oscillation frequency equal to said first frequency as a result of injection locking;
    (c) an injection coupling circuit coupled between said input node and said oscillator circuit for injection locking said oscillator circuit such that said oscillation frequency is equal to said first frequency; and
    (d) first and second output nodes coupled to said oscillator circuit for providing an output signal having a second frequency,
    wherein said second frequency is a multiple of said first frequency.

2. The circuit of claim 1 wherein said oscillator circuit is a ring oscillator comprising a first phase shifting circuit and a second phase shifting circuit, each of said phase shifting circuits having an input and an output and wherein the output of said first phase shifting circuit is coupled to the input of said second phase shifting circuit and the output of said second phase shifting circuit is cross-coupled to the input of said first phase shifting circuit.

3. The circuit of claim 1 wherein said oscillator circuit comprises first, second, third and fourth phase shifting circuits, each of said phase shifting circuits having an input, a ring output and a high frequency output, wherein the ring output of said first phase shifting circuit is coupled to the input of said second phase shifting circuit, the ring output of said second phase shifting circuit is coupled to the input of said third phase shifting circuit, the ring output of said third phase shifting circuit is coupled to the input of said fourth phase shifting circuit, the ring output of said fourth phase shifting circuit is coupled to the input of said first phase shifting circuit and wherein the high frequency outputs of said first and third phase shifting circuits are coupled to a first pair of output nodes and wherein the high frequency outputs of said second and fourth phase shifting circuits are coupled to a second pair of output nodes.

4. A frequency multiplying circuit, said circuit comprising:
    (I) a first frequency multiplier comprising,
        (a) an input node for receiving an input signal having a first frequency;
        (b) an oscillator circuit coupled to said input node for producing first and second differential signals having an oscillation frequency equal to said first frequency;
        (c) an injection coupling circuit coupled between said input node and said oscillator circuit for injection locking said oscillation circuit such that said oscillation frequency is equal to said first frequency; and
        (d) first and second output nodes coupled to said oscillator for providing an output signal having a second frequency, wherein said second frequency is a multiple of said first frequency; and
    (II) a second frequency multiplier comprising,
        (a) first and second input nodes respectively coupled to said first and second output nodes;
        (b) an oscillator circuit coupled to said first and second input nodes for producing first and second differential signals having an oscillation frequency equal to said second frequency;
        (c) an injection coupling circuit coupled between said first and second input nodes and said oscillator circuit for injection locking said oscillation circuit such that said oscillation frequency is equal to said second frequency; and
        (d) first and second output nodes coupled to said oscillator for providing an output signal having a third frequency, wherein said third frequency is a multiple of said second frequency.

5. The circuit of claim 4 wherein said first frequency multiplier includes first, second, third and fourth phase shifting circuits, each of said phase shifting circuits having an input and an output, wherein the output of said first phase shifting circuit is coupled to the input of said second phase shifting circuit, the output of said second phase shifting circuit is coupled to the input of said third phase shifting circuit, the output of said third phase shifting circuit is coupled to the input of said fourth phase shifting circuit, the output of said fourth phase shifting circuit is cross-coupled to the input of said first phase shifting circuit and wherein the output of the first phase shifting circuit is coupled to said first input node of the second frequency multiplier and the output of the third phase shifting circuit is coupled to said second input node of the second frequency multiplier.

6. The circuit of claim 5 wherein said second frequency multiplier includes first and second phase shifting circuits, each of said phase shifting circuits of said second frequency multiplier having an input and an output, wherein the output of said first phase shifting circuit of said second frequency multiplier is coupled to the input of said second phase shifting circuit of said second frequency multiplier, the output of said second phase shifting circuit of said second frequency multiplier is cross-coupled to the input of said first phase shifting circuit of said second frequency multiplier and wherein said output of said first phase shifting circuit of said second frequency multiplier is coupled to one of said output nodes of said second frequency multiplier and said output of said second phase shifting circuit of said second frequency multiplier is coupled to the other of said output nodes of said second frequency multiplier.

7. The circuit of claim 4 wherein said first frequency multiplier includes first and second phase shifting circuits, each of said phase shifting circuits of said first frequency multiplier having an input and an output, wherein the output of said first phase shifting circuit of said first frequency multiplier is coupled to the input of said second phase shifting circuit of said first frequency multiplier, the output of said second phase shifting circuit of said first frequency multiplier is cross-coupled to the input of said first phase shifting circuit of said first frequency multiplier and wherein the output of the first phase shifting circuit is coupled to said first input node of the second frequency multiplier and the output of the second phase shifting circuit is coupled to said second input node of the second frequency multiplier.

8. The circuit of claim 7 wherein said second frequency multiplier includes first and second phase shifting circuits, each of said phase shifting circuits of said second frequency multiplier having an input and an output, wherein the output of said first phase shifting circuit of said second frequency multiplier is coupled to the input of said second phase shifting circuit of said second frequency multiplier, the output of said second phase shifting circuit of said second frequency multiplier is cross-coupled to the input of said first phase shifting circuit of said second frequency multiplier and wherein said output of said first phase shifting circuit of said second frequency multiplier is coupled to one of said output nodes of said second frequency multiplier, and said output of said second phase shifting circuit of said second frequency multiplier is coupled to the other of said output nodes of said second frequency multiplier.

* * * * *